(12) United States Patent
Hou et al.

(10) Patent No.: US 9,159,809 B2
(45) Date of Patent: Oct. 13, 2015

(54) MULTI-GATE TRANSISTOR DEVICE

(75) Inventors: Hsin-Ming Hou, Tainan (TW); Ji-Fu Kung, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 352 days.

(21) Appl. No.: 13/407,769

(22) Filed: Feb. 29, 2012

(65) Prior Publication Data

US 2013/0221407 A1 Aug. 29, 2013

(51) Int. Cl.
H01L 21/28 (2006.01)
H01L 29/78 (2006.01)
H01L 21/20 (2006.01)
H01L 29/66 (2006.01)

(52) U.S. Cl.
CPC ........ H01L 29/66803 (2013.01); H01L 29/785 (2013.01)

(58) Field of Classification Search
CPC .......... H01L 29/78; H01L 21/28; H01L 21/20
USPC ........................................... 257/192
See application file for complete search history.

(56) References Cited

U.S. PATENT DOCUMENTS

| | | | |
|---|---|---|---|
| 5,471,075 A * | 11/1995 | Shekar et al. | 257/139 |
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,183,606 B2 * | 2/2007 | Wang et al. | 257/315 |
| 7,247,887 B2 | 7/2007 | King | |
| 7,250,658 B2 | 7/2007 | Doris | |
| 7,309,626 B2 | 12/2007 | Ieong | |
| 7,316,959 B2 * | 1/2008 | Mimura et al. | 438/297 |
| 7,352,034 B2 | 4/2008 | Booth, Jr. | |
| 7,470,570 B2 | 12/2008 | Beintner | |
| 7,531,437 B2 * | 5/2009 | Brask et al. | 438/585 |
| 7,569,857 B2 | 8/2009 | Simon | |
| 8,153,493 B2 * | 4/2012 | Lee | 438/294 |
| 8,294,180 B2 * | 10/2012 | Doyle et al. | 257/192 |
| 8,354,695 B2 * | 1/2013 | Bhuwalka et al. | 257/192 |
| 8,373,229 B2 * | 2/2013 | Chen et al. | 257/347 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |

(Continued)

OTHER PUBLICATIONS

Hu et al.,"Green Transistor-A V Scaling Path for Future Low Power ICs",Aug. 2008,IEEE,978-1-4244-1615.*
Bowonder et al., Low-Voltage Green Transistor Using Hetero-Tunneling, 2008.

(Continued)

*Primary Examiner* — Evan Pert
*Assistant Examiner* — Damon Hillman
(74) *Attorney, Agent, or Firm* — Winston Hsu; Scott Margo

(57) ABSTRACT

A multi-gate transistor device includes a substrate, a fin structure extending along a first direction formed on the substrate, a gate structure extending along a second direction formed on the substrate, a drain region having a first conductivity type formed in the fin structure, a source region having a second conductivity type formed in the fin structure, and a first pocket doped region having the first conductivity type formed in and encompassed by the source region. The first conductivity type and the second conductivity type are complementary to each other.

19 Claims, 6 Drawing Sheets

(56) References Cited

U.S. PATENT DOCUMENTS

| | | |
|---|---|---|
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0140716 A1* | 6/2010 | Lin et al. ................. 257/369 |
| 2010/0144121 A1 | 6/2010 | Chang |
| 2010/0167506 A1 | 7/2010 | Lin |

OTHER PUBLICATIONS

Hu et al., Green Transistor—A VDD Scaling Path for Future Low Power ICs, 2008.

Bowonder et al., Low-Voltage Green Transistor Using Ultra Shallow Junction and Hetero-Tunneling, 2008.

Chenming Hu, Green Transistor as a Solution to the IC Power Crisis, 2008.

Chenming Hu, Reduce Ic Power Consumption by >10× with a Green Transistor? ,2009.

Hu et al., Prospect of Tunneling Green Transistor for 0.1V CMOS, 2010.

\* cited by examiner

MULTI-GATE TRANSISTOR DEVICE

BACKGROUND OF THE INVENTION

1. Field of the Invention

The present invention relates to a multi-gate transistor device, and more particularly, to a green fin field effect transistor (FinFET) device based on quantum mechanical tunneling effect.

2. Description of the Prior Art

Complementary metal-oxide-semiconductor (CMOS) field effect transistor is one of the core elements of the integrated circuits (ICs). As dimensions and operation voltages of CMOS device are continuously reduced or scaled down, higher performance and packaging density of the ICs are achieved. However, it is found that the power consumptions of CMOS device keeps increasing because the off-state leakage currents are increasing and a fact that the subthreshold slop is limited to minimally about 60 mV/decade. Therefore, there has been developed the tunneling field effect transistor (hereinafter abbreviated as TFET) device as a countermeasure against to the abovementioned problem.

Please refer to FIG. 1, which is a schematic drawing of a conventional TFET device. Different from the conventional MOSFET device of which the source and drain have the same conductivity type, the TFET device includes the source and drain having different conductivity types. As shown in FIG. 1, the conventional TFET device 10 includes a substrate 12, a gate structure 14, an n-type source 16 and a p-type drain 18 (or a p-type source 16 and an n-type drain 18). As well-known to those skilled in the art, the conventional TFET device 10 fully controls source tunneling barrier and may act as either an n-channel device or a p-channel device depending on the gate voltage applied to the gate structure 14.

Please refer to FIGS. 2A and 2B, which respectively show a band diagram of the conventional TFET device in the OFF-state and the ON-state. As shown in FIG. 2A, when the TFET device 10 is in the OFF-state, the gate bias voltage is zero with insufficient band bending to allow tunneling and thus the leakage current is extremely low. When the TFET device 10 is in the ON-state, sufficient band bending is caused and thus electrons tunnel through from the valence band of the p-source to the conduction band of the n-drain. Since the TFET device has the advantages of low off-state leakage currents and low power consumption, it is taken as a promising green device in the future semiconductor industry.

Nevertheless, though the TFET device efficaciously solves the off-state leakage currents problem, it cannot be scaled down as expected due to the short channel effect (SCE). Besides, the TFET device still suffers the problem of drain-induced barrier lowering (DIBL) leakage.

Therefore, it is still in need to develop an approach that is able to solve the aforementioned power consumption problem, to suppress SCE and DIBL leakage, and to keep scaling down the device.

SUMMARY OF THE INVENTION

According to an aspect of the present invention, a multi-gate transistor device is provided. The multi-gate transistor device includes a substrate, a fin structure positioned on the substrate and extending along a first direction, a gate structure positioned on the substrate and extending along a second direction, a drain region formed in the fin structure and having a first conductivity type, a source region formed in the fin structure and having a second conductivity type complementary to the first conductivity type, and a first pocket doped region formed in and encompassed by the source region. The first pocket doped region has the first conductivity type.

According to the multi-gate transistor device provided by the present invention, the source region and the drain region having different conductivity types are formed to construct a TFET device, and the pocket doped region formed in the source region provides larger on current ($I_{on}$) and lower turn-on voltage ($V_{on}$). More important, the multi-gate transistor device provided by the present invention is a fin field effect transistor (FinFET) device, therefore SCE and DIBL leakage that unavoidably occurred in the conventional planar transistor device are successfully suppressed. And thus scale of the multi-gate transistor device can be shrunk as expectation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-6 are schematic drawings of a multi-gate transistor device provided by a first preferred embodiment of the present invention, wherein FIG. 4 is a cross-sectional view taken along Line $A_1$-$A_1'$ in FIG. 3;

FIG. 5 is a cross-sectional view taken along Line $B_1$-$B_1'$ in FIG. 3; and

FIG. 6 is a cross-sectional view taken along Line $C_1$-$C_1'$ in FIG. 3.

FIGS. 7-10 are schematic drawings of a multi-gate transistor device provided by a second preferred embodiment of the present invention, wherein FIG. 8 is a cross-sectional view taken along Line $A_2$-$A_2'$ in FIG. 7;

FIG. 9 is a cross-sectional view taken along Line $B_2$-$B_2'$ in FIG. 7; and

FIG. 10 is a cross-sectional view taken along Line $C_2$-$C_2'$ in FIG. 7.

DETAILED DESCRIPTION

Figure 1:
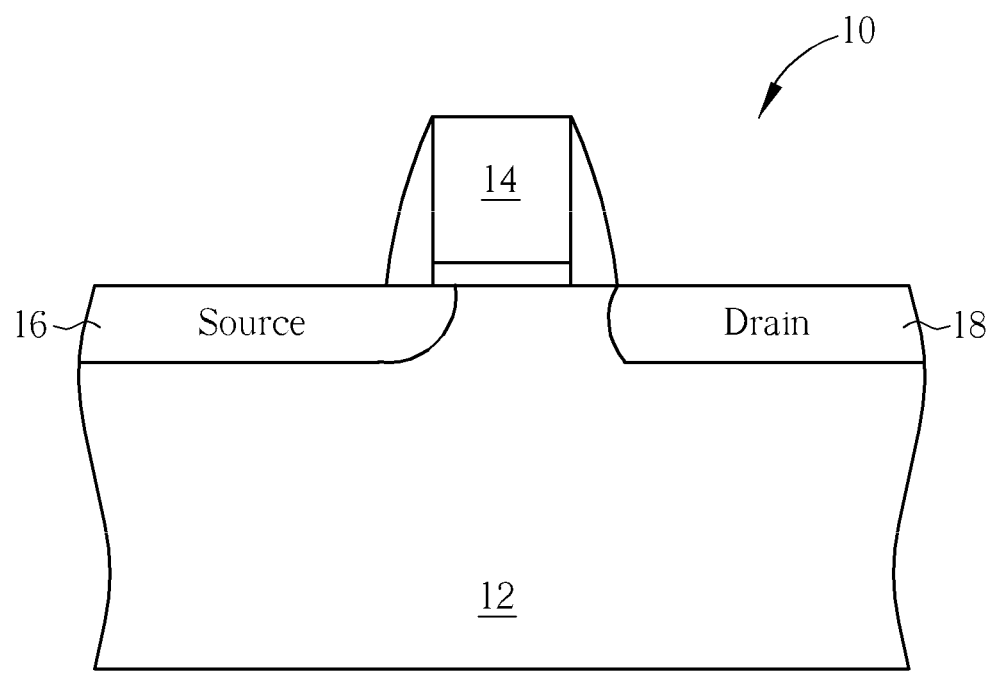
FIG. 1 is a schematic drawing of a conventional TFET device.
Figure 2A:
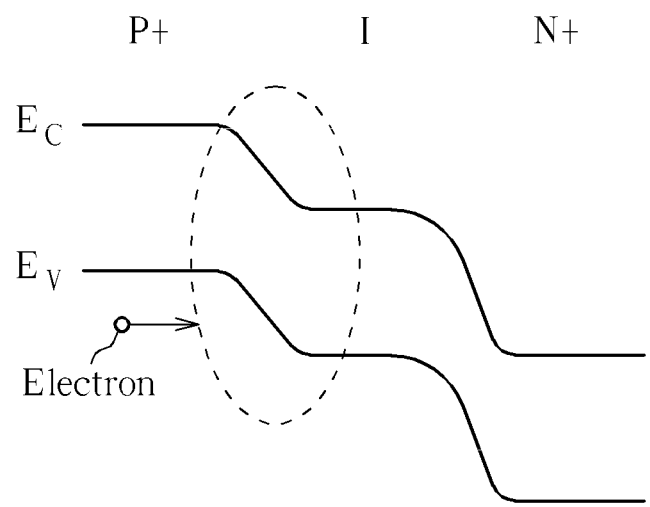
FIG. 2A shows a band diagram of the conventional TFET device in the OFF-state
Figure 2B:
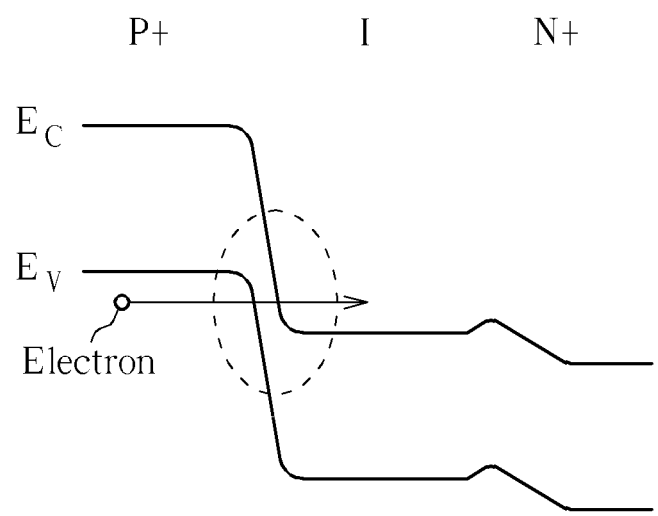
FIG. 2B shows a band diagram of the conventional TFET device in the ON-state.
Figure 3:
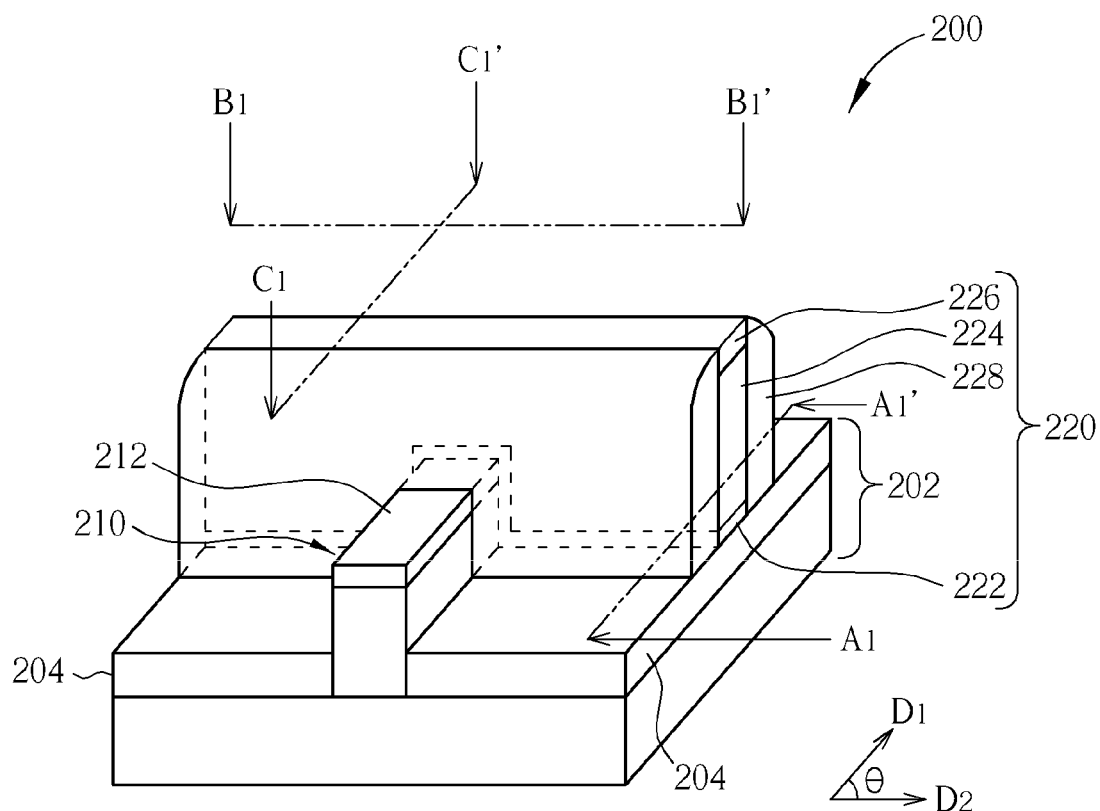
Figure 4:
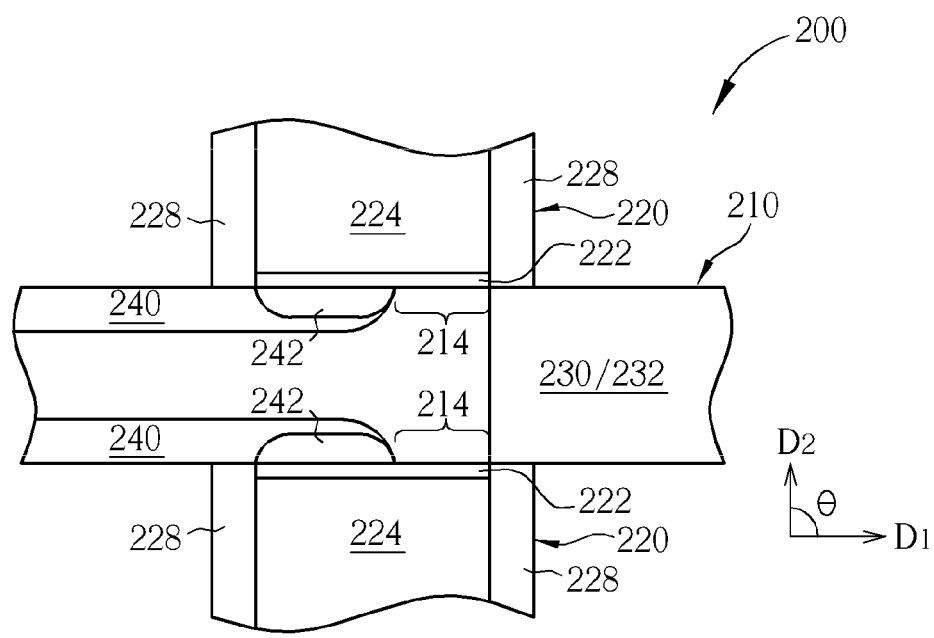
Figure 5:
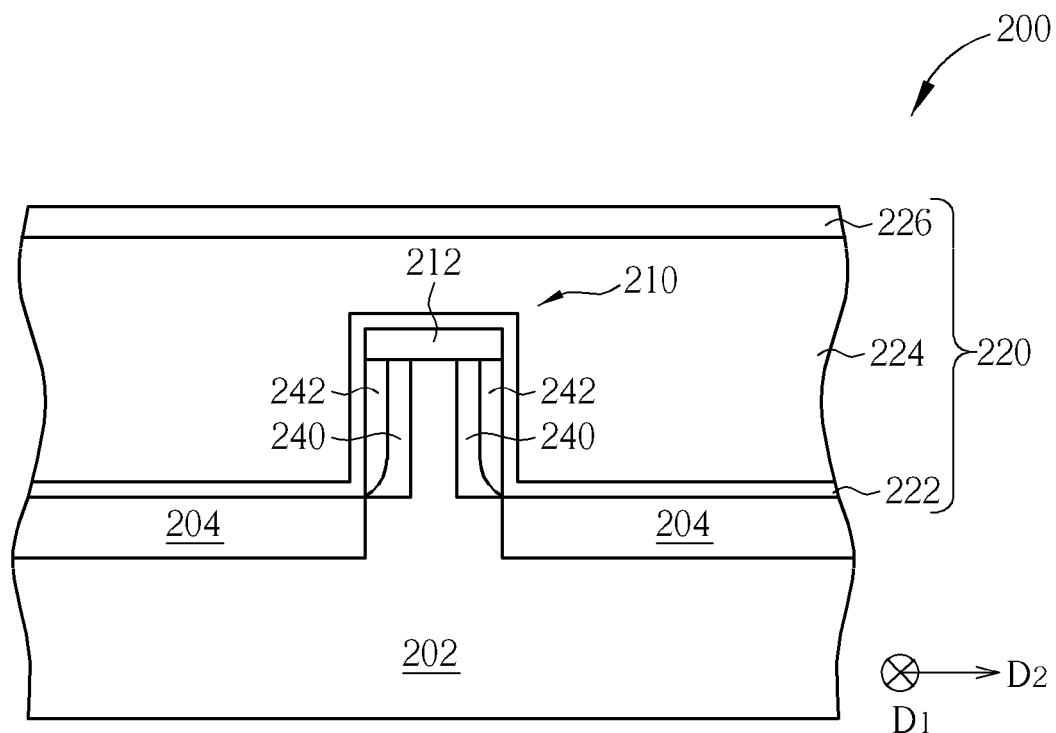
Figure 6:
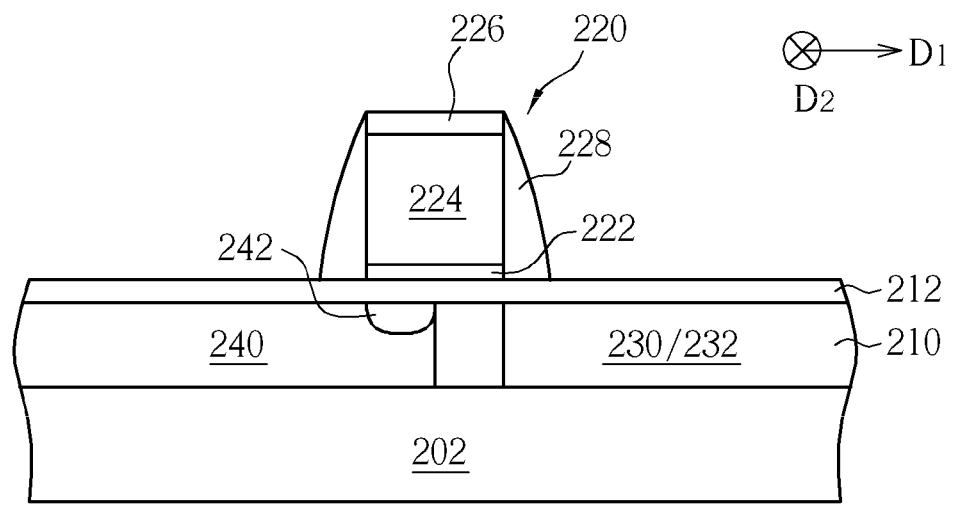

Please refer to FIGS. 3-6, which are schematic drawings of a multi-gate transistor device provided by a first preferred embodiment of the present invention, and FIGS. 4-6 are cross-sectional views respectively taken along Line $A_1$-$A_1'$, Line $B_1$-$B_1'$, and Line $C_1$-$C_1'$ in FIG. 3. As shown in FIGS. 3-6, a multi-gate transistor device 200 provided by the preferred embodiment includes a substrate 202. In the preferred embodiment, the substrate 202 can be a bulk silicon substrate having a plurality of shallow trench isolations (STIs) 204 formed therein for providing electrical isolation. However, the substrate 202 provided by the preferred embodiment also can be a silicon-on-insulator (SOI) substrate.

As shown in FIGS. 3-6, a fin structure 210 is positioned on the substrate 202. The fin structure 210 extending along a first direction $D_1$ is defined by a patterned hard mask 212. The fin structure 210 includes a width and a height, and a ratio between the width and the height is about 1:1.5-1:2, but not limited to this. It is noteworthy that since the patterned hard mask 212 is not removed from the fin structure 210 in accordance with the preferred embodiment, the multi-gate transistor device 200 of the preferred embodiment is a dual-gate transistor device.

Please still refer to FIGS. 3-6. The multi-gate transistor device 200 provided by the preferred embodiment also includes a gate structure 220 formed on the substrate 202. The gate structure 220 includes a gate dielectric layer 222, a gate conductive layer 224, and a patterned hard mask 226. As shown in FIGS. 3-6, the gate structure 220 extends along a second direction $D_2$. The first direction $D_1$ and the second direction $D_2$ have an included angle θ, and the included angle θ preferably is 90°. In other words, the gate structure 220 and the fin structure 210 are perpendicular to each other. The gate structure 220 covers a portion of the fin structure 210, that is, the gate dielectric layer 222 and the gate conductive layer 224 cover a portion of sidewalls of the fin structure 210. The gate dielectric layer 222 includes the conventional dielectric material such as silicon oxide (SiO), silicon nitride (SiN), or silicon oxynitride (SiON). In the preferred embodiment, the gate dielectric layer 222 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. The gate conductive layer 224 can include polysilicon layer or metal layer. For example, when the gate dielectric layer 222 includes high-k material in the preferred embodiment, metal gate process is introduced to the present invention to obtain control gate compatible to the high-K gate dielectric layer. Accordingly, the gate conductive layer 224 can include different materials depending to the gate-first or gate-last process. The patterned hard mask 226 includes, for example but not limited to, SiN. Additionally, a spacer 228 can be formed on sidewalls of the gate structure 220 as shown in FIGS. 3-6.

The multi-gate transistor device 200 provided by the preferred embodiment further includes a drain region 230 and a source region 240. The drain region 230 is formed in the fin structure 210 and has a first conductivity type. Additionally, strain-silicon technology can be applied in the drain region 230 and the source region 240 in the preferred embodiment, therefore the drain region 230/source region 240 can include an epitaxial layer 232, and the epitaxial layer 232 is different depending on the first conductivity type. For example, the first conductivity type is preferably p type in the preferred embodiment, therefore the epitaxial layer 232 can include silicon germanium (SiGe). However when the first conductivity type is n type, the epitaxial layer 232 consequently includes silicon carbide (SiC).

The source region 240 is also formed in the fin structure 210. As shown in FIGS. 4-6, the drain region 230 and the source region 240 are formed in the fin structure 210 respectively at two opposite sides of the gate structure 220. In other words, the drain region 230 and the source region 240 are spaced apart from each other. It is noteworthy that in the preferred embodiment, the source region 240 has a second conductivity type, and the first conductivity type and the second conductivity type are complementary to each other. Therefore, when the drain region 230 is a p-drain in accordance with the preferred embodiment, the source region 240 is an n-source. And those skilled in the art would easily realize that when the drain region 230 is an n-drain, the source region 240 is a p-source. That is, the first conductivity type is different from the second conductivity type. More important, a pocket doped region 242 is formed in the source region 240. Particularly speaking, the pocket doped region 242 is encompassed by the source region 240 therefore the pocket doped region 242 is a floating doped region. The pocket doped region 242 has the first conductivity type that is p type in the preferred embodiment. The gate structure 220 covers a portion of the source region 240 but the gate structure 220 covers the entire pocket doped region 242 as shown in FIGS. 3-6. Furthermore, since the multi-gate transistor device 200 is a dual-gate transistor device, the pocket doped region 242 is formed at two opposite sidewalls of the fin structure 210, and thus it is taken as two individual pocket doped regions 242 that are parallel with each other as shown in FIGS. 4 and 5.

According to the preferred embodiment, when the multi-gate transistor device 200 serves as a p-channel transistor, a negative voltage is applied to the gate structure 220 and thus pulls down the potential of the floating p-type pocket doped region 242. As a result, electrons are caused to tunnel from the p-type pocket doped region 242 to the n-type source region 240. The holes generated behind in the p-type pocket doped region 242 are swept to the p-type drain region 230 as the drain current. Accordingly, the multi-gate transistor device 200 provides larger $I_{on}$ and lower $V_{on}$. On the other hand, when the drain region 230 is an n-drain, the source region 240 is a p-source, and the pocket doped region 242 formed in the source region 240 is an n-type region, the multi-gate transistor device 200 serves as an n-channel transistor device, and a positive voltage is applied to the gate structure 220. As a result, valence electrons are caused to tunnel from the p-type source region 240 to the n-type pocket doped region 242. The electrons so generated in the n-type floating pocket doped region 242 then drift to the n-type drain 230 as the drain current.

According to the dual-gate transistor device 200 provided by the preferred embodiment, the pocket doped region 242 formed in the source region 240 provides larger $I_{on}$ and lower $V_{on}$. More important, the dual-gate transistor device 200 is a FinFET device, therefore the SCE and DIBL leakage which always found in the conventional planar MOSFET are successfully suppressed, and thus the scale of the dual-gate transistor device 200 can be shrunk as expectation.

Figure 7:
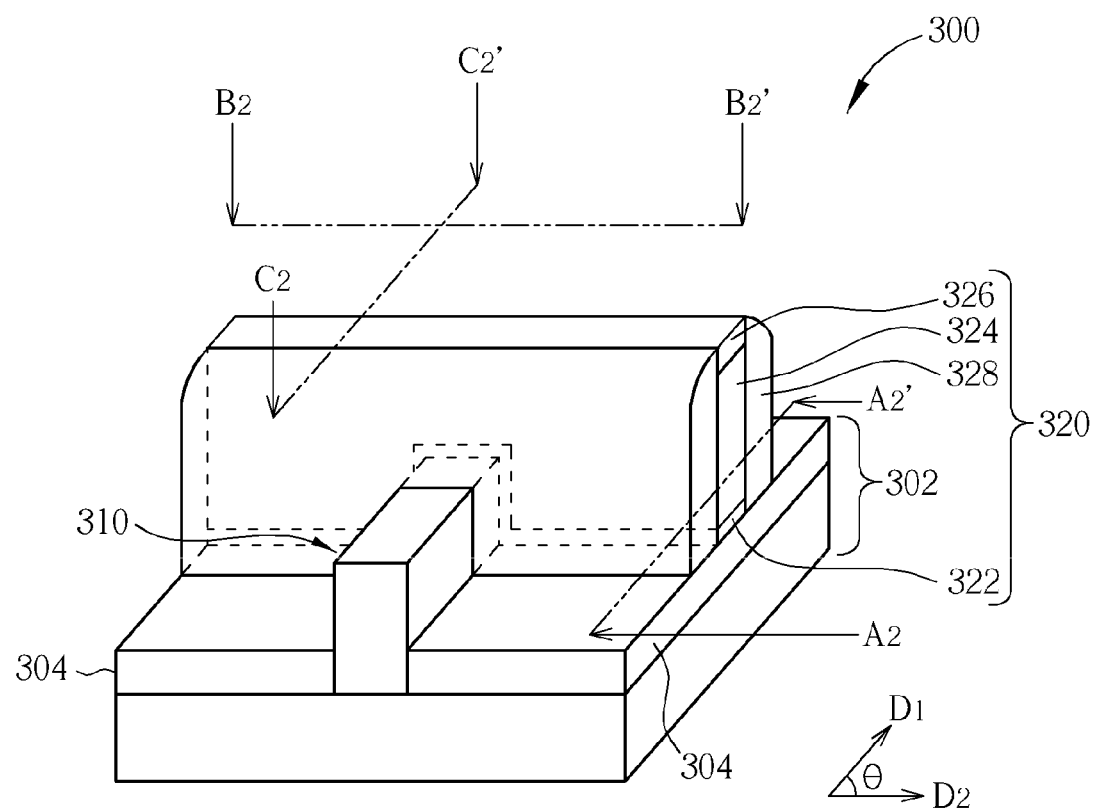
Figure 8:
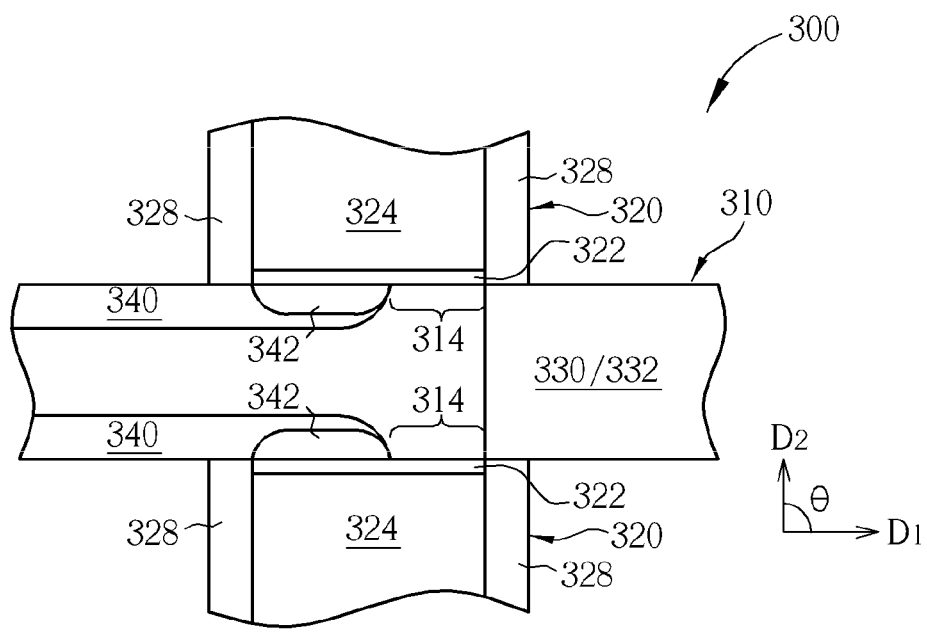
Figure 9:
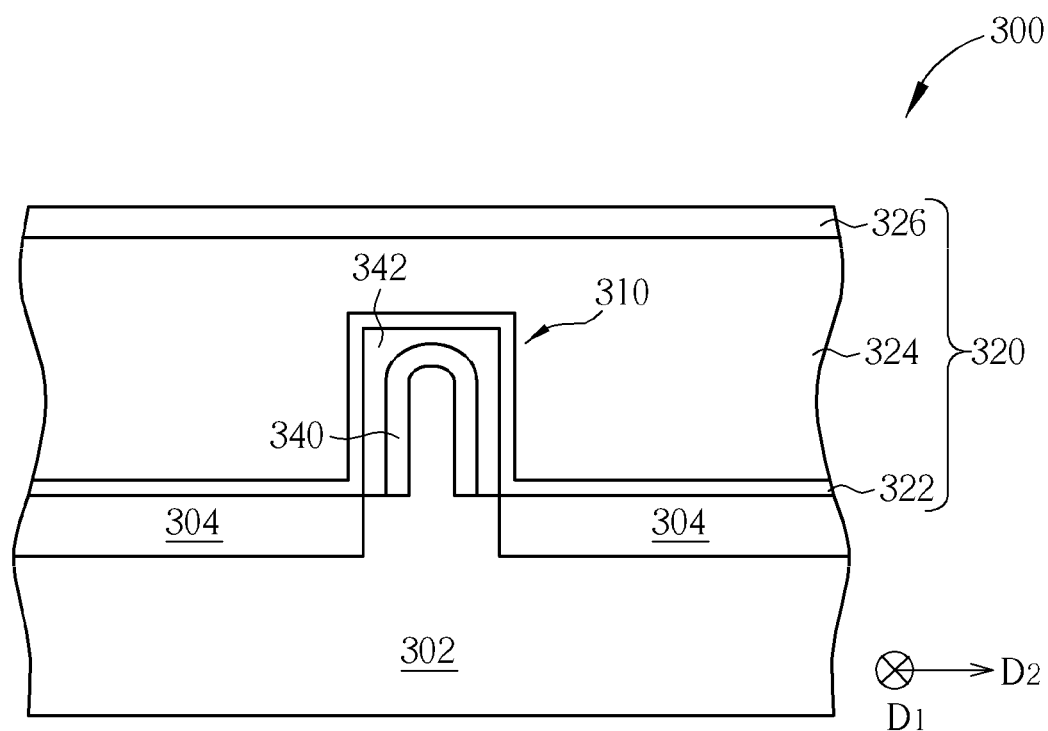
Figure 10:
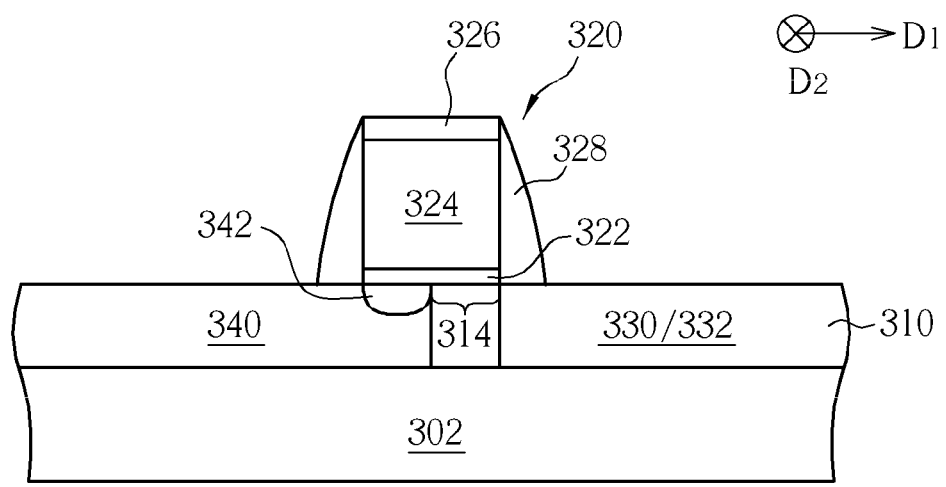

Please refer to FIGS. 7-10, which are schematic drawings of a multi-gate transistor device provided by a second preferred embodiment of the present invention, and FIGS. 8-10 are cross-sectional views respectively taken along Line $A_2$-$A_2$', Line $B_2$-$B_2$', and Line $C_2$-$C_2$' in FIG. 7. As shown in FIGS. 7-10, a multi-gate transistor device 300 provided by the preferred embodiment includes a substrate 302. In the preferred embodiment, the substrate 302 can be a bulk silicon substrate having a plurality of STIs 304 formed therein. However, the substrate 302 provided by the preferred embodiment also can be a SOI substrate.

As shown in FIGS. 7-10, a fin structure 310 is positioned on the substrate 302. The fin structure 310 extending along a first direction $D_1$ is defined by a patterned hard mask (not shown). The fin structure 310 includes a width and a height, and a ratio between the width and the height is about 1:1.5-1:2, but not limited to this. It is noteworthy that since the patterned hard mask is removed from the fin structure 310 in accordance with the preferred embodiment, the multi-gate transistor device 300 of the preferred embodiment is a tri-gate transistor device.

Please still refer to FIGS. 7-10. The multi-gate transistor device 300 provided by the preferred embodiment also includes a gate structure 320 formed on the substrate 302. The gate structure 320 includes a gate dielectric layer 322, a gate conductive layer 324, and a patterned hard mask 326. As shown in FIGS. 7-10, the gate structure 320 extends along a second direction $D_2$. The first direction $D_1$ and the second direction $D_2$ have an included angle θ, and the included angle θ preferably is 90°. In other words, the gate structure 320 and the fin structure 310 are perpendicular to each other. The gate structure 320 covers a portion of the fin structure 310, that is, the gate dielectric layer 322 and the gate conductive layer 324 cover a portion of top and sidewalls of the fin structure 310. The gate dielectric layer 322 can include materials as aforementioned, and the gate conductive layer 324 can include polysilicon layer or metal layer. As mentioned above, when the gate dielectric layer 322 includes high-k material in the preferred embodiment, metal gate process is introduced to the present invention to obtain control gate compatible to the high-K gate dielectric layer. Accordingly, the gate conductive layer 324 can include different materials depending on the gate-first or gate-last process. The patterned hard mask 326 includes, for example but not limited to, SiN. Additionally, a spacer 328 can be formed on sidewalls of the gate structure 320 as shown in FIGS. 7-10.

The multi-gate transistor device 300 provided by the preferred embodiment further includes a drain region 330 and a source region 340. The drain region 330 is formed in the fin structure 310 and has a first conductivity type. Additionally, strain-silicon technology can be applied in the drain region 330 and the source region 340 in the preferred embodiment; therefore the drain region 330/source region 340 can include an epitaxial layer 332. As mentioned above, the epitaxial layer 332 is different depending on the first conductivity type. For example, the first conductivity type is preferably a p type in the preferred embodiment; therefore the epitaxial layer 332 can include SiGe. However when the first conductivity type is an n type, the epitaxial layer 332 consequently includes SiC.

The source region 340 is also formed in the fin structure 310. As shown in FIGS. 8-10, the drain region 330 and the source region 340 are formed in the fin structure 310 respectively at two opposite sides of the gate structure 320. In other words, the drain region 330 and the source region 340 are spaced apart from each other. It is noteworthy that in the preferred embodiment, the source region 340 has a second conductivity type, and the first conductivity type and the second conductivity type are complementary to each other. Therefore, when the drain region 330 is a p-drain in accordance with the preferred embodiment, the source region 340 is an n-source. And those skilled in the art would easily realize that when the drain region 330 is an n-drain, the source region 340 is a p-source. More important, a pocket doped region 342 is formed in the source region 340. Particularly speaking, the pocket doped region 342 is encompassed by the source region 340 therefore the pocket doped region 342 is a floating doped region. The pocket doped region 342 has the first conductivity type that is p type in the preferred embodiment. The gate structure 320 covers a portion of the source region 340 but the gate structure 320 covers the entire pocket doped region 342 as shown in FIGS. 8-10. Furthermore, since the multi-gate transistor device 300 is a tri gate transistor device, the pocket doped region 342 is formed at two sidewalls and top of the fin structure 310, and thus has an inverted U shape.

As mentioned above, when the multi-gate transistor device 300 serves as a p-channel transistor, a negative voltage is applied, and when the multi-gate transistor device 300 serves as an n-channel transistor device, and a positive voltage is applied to the gate structure 320. As a result, larger $I_{on}$ and lower $V_{on}$ are obtained due to the electron tunneling effect.

According to the tri-gate transistor device 300 provided by the preferred embodiment, the pocket doped region 342 formed in the source region 340 provides larger $I_{on}$ and lower $V_{on}$. More important, the tri-gate transistor device 300 is a FinFET device, therefore the SCE and DIBL leakage which always found in the conventional planar MOSFET are successfully suppressed, and thus the scale of the tri-gate transistor device 300 can be shrunk as expectation.

It is noteworthy that in the preferred embodiment, the fin structure 210/310 can include different materials therein. For example, a surface of the multi-gate transistor device 200/300 can include material different from the multi-gate transistor device 200/300 bulk. Preferably, the surface of the multi-gate transistor device 200/300 includes materials having energy gap (Eg) smaller than the multi-gate transistor device 200/300 bulk. Exemplarily, when the multi-gate transistor device 200/300 bulk includes bulk silicon, the surface of the multi-gate transistor device 200/300 can include III-IV compound semiconductor. In other words, the multi-gate transistor device 200/300 includes a hetero-channel region according to the preferred embodiments. To an n-channel transistor device, the hetero-channel region cause a difference between conduction bands (ΔEc) being larger than 0 eV while the hetero-channel region cause a difference between valence bands (ΔEv) being smaller than 0 eV to a p-channel transistor device. Accordingly, the hetero-channel region improves the quantum mechanical tunneling currents of both of the n-channel and p-channel Fin TFET devices, and thus $I_{on}$ is increased. Furthermore, when an energy gap (Eg) of the drain region 230/330 and of the source region 240/340 is larger than Eg of the channel region 214/314, $I_{off}$ flow from the channel to the source/drain is suppressed due to Boltzmann distribution law.

According to the multi-gate transistor device provided by the present invention, the source region and the drain region having different conductivity types are formed to construct a TFET device, and the pocket doped region formed in the source region provides larger $I_{on}$ and lower $V_{on}$. More important, the multi-gate transistor device provided by the present invention is a FinFET device, therefore SCE and DIBL leakage that unavoidably occurred in the conventional planar transistor device are successfully suppressed. And thus scale of the multi-gate transistor device can be shrunk as expectation. Furthermore, the hetero-channel region is provided to increase $I_{on}$ and to lower $I_{off}$. In addition, since the multi-gate transistor device of the present invention can be integrated with strained silicon and metal gate technologies, performance of the multi-gate transistor device provided by the present invention is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A multi-gate transistor device comprising:
   a substrate;
   a fin structure positioned on the substrate and extending along a first direction;
   a gate structure positioned on the substrate and extending along a second direction;
   a drain region formed in the fin structure and having a first conductivity type;
   a source region formed in the fin structure and having a second conductivity type different from the first conductivity type;
   a first pocket doped region formed in and encompassed by the source region, the first pocket doped region having the first conductivity type and
   a second pocket doped region, wherein the first pocket doped region and the second pocket doped region are respectively formed at two opposite sidewalls of the fin structure.

2. The multi-gate transistor device according to claim 1, wherein the substrate comprises a bulk silicon substrate or a silicon-on-insulator (SOI) substrate.

3. The multi-gate transistor device according to claim 1, wherein the first direction and the second direction are perpendicular to each other.

4. The multi-gate transistor device according to claim 3, wherein the gate structure covers a portion of the fin structure.

5. The multi-gate transistor device according to claim 4, the drain region and the source region are formed in the fin structure respectively at two opposite sides of the gate structure.

6. The multi-gate transistor device according to claim 4, wherein the gate structure covers a portion of the source region.

7. The multi-gate transistor device according to claim 6, wherein the gate structure covers the entire first pocket doped region.

8. The multi-gate transistor device according to claim 1, further comprising a hetero-channel region.

9. The multi-gate transistor device according to claim 1, wherein the multi-gate transistor device is a dual-gate transistor device.

10. The multi-gate transistor device according to claim 1, wherein the first pocket doped region and the second pocket doped region are parallel with each other.

11. The multi-gate transistor device according to claim 1, wherein the multi-gate transistor device is a tri-gate transistor device.

12. The multi-gate transistor device according to claim 1, wherein the gate structure comprises a gate dielectric layer and a gate conductive layer.

13. The multi-gate transistor device according to claim 12, wherein the gate conductive layer comprises a polysilicon layer or a metal layer.

14. The multi-gate transistor device according to claim 1, wherein the drain region comprises an epitaxial layer.

15. A multi-gate transistor device comprising:
    a substrate;
    a fin structure positioned on the substrate and extending along a first direction;
    a gate structure positioned on the substrate and extending along a second direction;
    a drain region formed in the fin structure and having a first conductivity type;
    a source region formed in the fin structure and having a second conductivity type different from the first conductivity type; and
    a first pocket doped region formed in and encompassed by the source region, the first pocket doped region having the first conductivity type, wherein the first pocket doped region is formed in sidewalls and top of the fin structure.

16. The multi-gate transistor device according to claim 15, wherein the first direction and the second direction are perpendicular to each other.

17. The multi-gate transistor device according to claim 15, wherein the gate structure covers a portion of the source region.

18. The multi-gate transistor device according to claim 17, wherein the gate structure covers the entire first pocket doped region.

19. The multi-gate transistor device according to claim 15, wherein the first pocket doped region comprises an inverted U-shape.

* * * * *